April 24, 1962 A. TYKULSKY ETAL 3,031,619

HIGH PRECISION MULTIPURPOSE REFERENCE OSCILLATOR CIRCUIT ARRANGEMENT

Filed Dec. 9, 1957 3 Sheets-Sheet 1

INVENTORS

Alexander Tykulsky

Jonas M. Shapiro

Stanley S. Tulgan

BY Daniel Jay Tick

Alfred E. Miller

Attorneys

April 24, 1962 A. TYKULSKY ETAL 3,031,619

HIGH PRECISION MULTIPURPOSE REFERENCE OSCILLATOR CIRCUIT ARRANGEMENT

Filed Dec. 9, 1957 3 Sheets-Sheet 2

INVENTORS
Alexander Tykulsky
Jonas M. Shapiro
Stanley S. Tulgan
BY Daniel Jay Tick
Alfred E. Miller
Attorneys INVENTORS
Alexander Tykulsky
Jonas M. Shapiro
Stanley S. Tulgan
BY Daniel Jay Tick
Alfred E. Miller
Attorneys United States Patent Office 3,031,619

Patented Apr. 24, 1962

3,031,619

HIGH PRECISION MULTIPURPOSE REFERENCE OSCILLATOR CIRCUIT ARRANGEMENT

Alexander Tykulsky, New York, N.Y., Jonas M. Shapiro, Stamford, Conn., and Stanley S. Tulgan, Jackson Heights, N.Y., assignors to Manson Laboratories Incorporated, Stamford, Conn., a corporation of Connecticut Filed Dec. 9, 1957, Ser. No. 701,632

8 Claims. (Cl. 324—79)

The present invention relates to a high precision multipurpose reference oscillator circuit arrangement. More particularly, the invention relates to a high precision multipurpose reference oscillator circuit arrangement comprising a temperature-controlled crystal oscillator frequency standard.

The principal object of the present invention is the provision of a high precision multipurpose reference oscillator circuit arrangement for producing a standard frequency signal having a stability of better than one part in $10^8$ per day.

An object of the present invention is the provision of a high precision multipurpose reference oscillator circuit arrangement for producing a standard frequency signal substantially free of incidental FM, hum modulation, AM or other noise.

Another object of the present invention is the provision of a high precision multipurpose reference oscillator circuit arrangement for producing a readily adjustable standard frequency signal.

Another object of the present invention is the provision of a high precision multipurpose reference oscillator circuit arrangement for measuring extraneous modulations in other equipment.

Another object of the present invention is the provision of a high precision multipurpose reference oscillator circuit arrangement for producing a sinusoidal standard frequency signal.

Another object of the present invention is the provision of a high precision multipurpose reference oscillator circuit arrangement for producing a one megacycle per second standard frequency signal adjustable over a range of $\pm 25$ cycles per second with an accuracy of $\pm .01$ cycle per second.

Another object of the present invention is the provision of a high precision multipurpose reference oscillator circuit arrangement for producing high quality pulses.

Another object of the present invention is the provision of a high precision multipurpose reference oscillator circuit arrangement for producing sharp positive and negative pulses substantially free of jitter.

Another object of the present invention is the provision of a high precision multipurpose reference oscillator circuit arrangement for producing millimicrosecond balanced pulses having appreciable harmonics up to 1000 megacycles per second.

Another object of the present invention is the provision of a high precision multipurpose reference oscillator circuit arrangement for determining a frequency to be measured in the range of 1 to 1000 megacycles per second.

Another object of the present invention is the provision of a high precision multipurpose reference oscillator circuit arrangement for determining a frequency to be measured in the range of 1 to 1000 megacycles per second without the use of auxiliary equipment.

Still another object of the present invention is the provision of a high precision multipurpose reference oscillator circuit arrangement for determining a frequency to be measured to a frequency of 1000 megacycles per second.

A further object of the present invention is the provision of a high precision multipurpose reference oscillator circuit arrangement for producing a standard frequency signal and high quality pulses and for determining a frequency to be measured in a highly efficient and economical manner and with exceptionally great accuracy.

Still a further object of the present invention is the provision of a high precision multipurpose reference oscillator circuit arrangement of highly compact and sturdy construction for producing a standard frequency signal and high quality pulses and for determining a frequency to be measured.

These and other objects of the invention are realized by the circuit arrangement of the present invention.

In accordance with the present invention, the circuit arrangement comprises means for producing a stable standard frequency signal, a substantially sinusoidal output signal having a frequency equal to said standard frequency being derived from said oscillator means, means for producing positive and negative pulses from said output signal, said pulses being derived from said pulse producing means, amplifying means interposed between said standard frequency producing means and said pulse producing means for applying said output signal to said pulse producing means, and means for mixing said pulses with a signal having a frequency to be measured, said pulses and a signal having a frequency to be measured being applied to said mixing means and a signal having a frequency indicative of said frequency to be measured being derived from said mixing means.

In order that the invention may be readily carried into effect, it will be described in greater detail with reference to the accompanying drawings, wherein.

Figure 1:
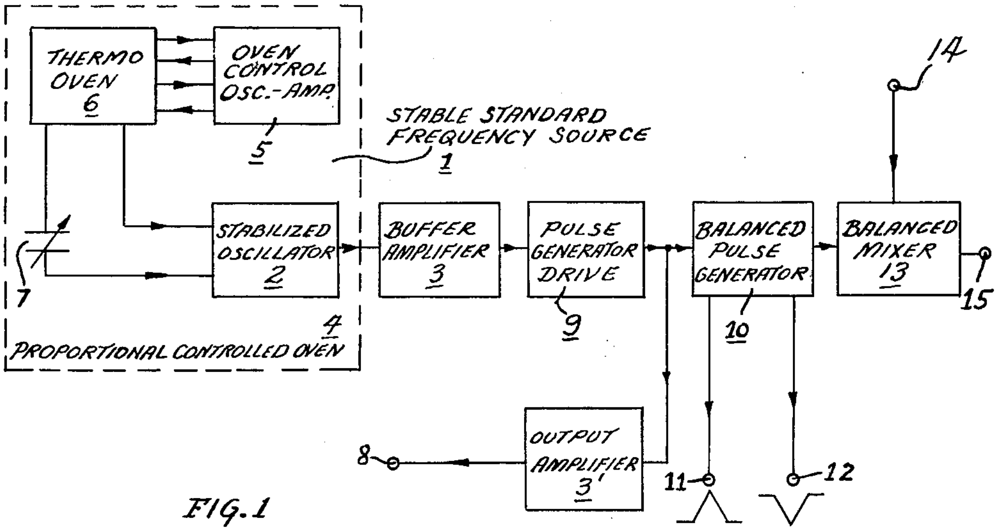
FIG. 1 is a schematic block diagram of an embodiment of the circuit arrangement of the present invention.
Figure 3:
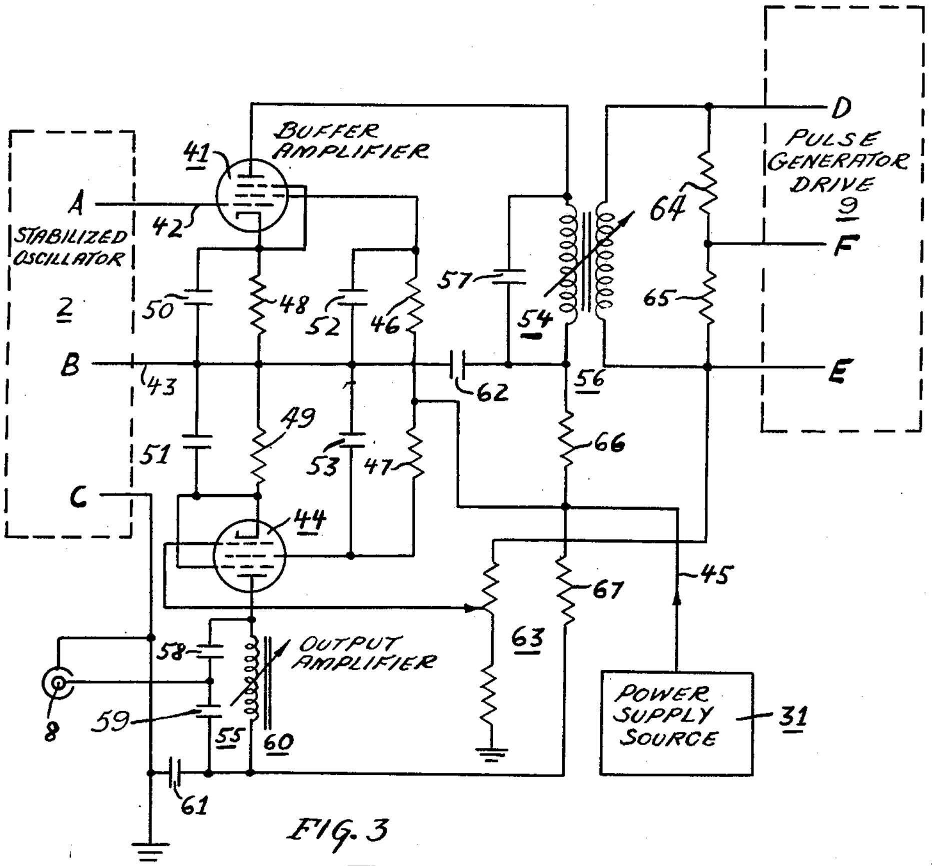
Figure 4:
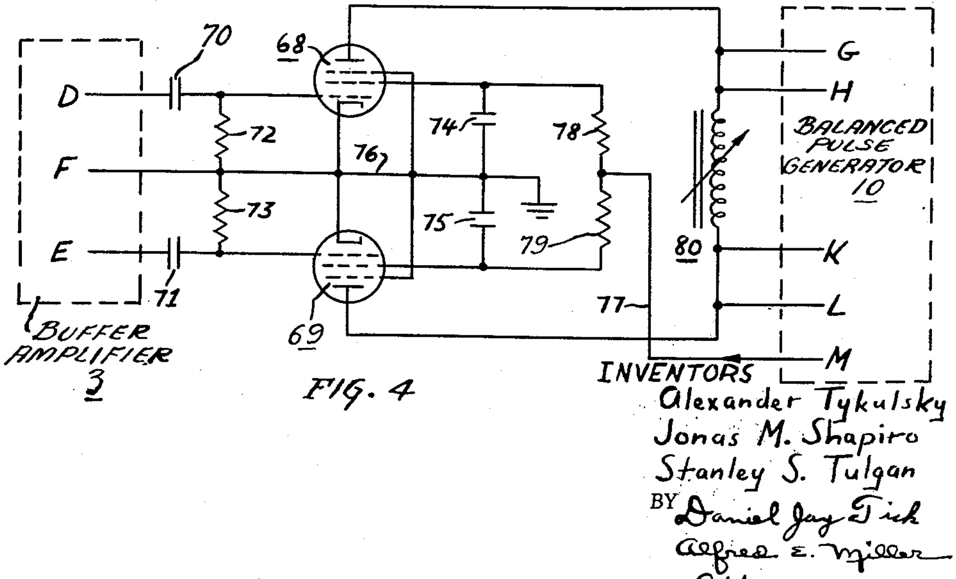
Figure 5:
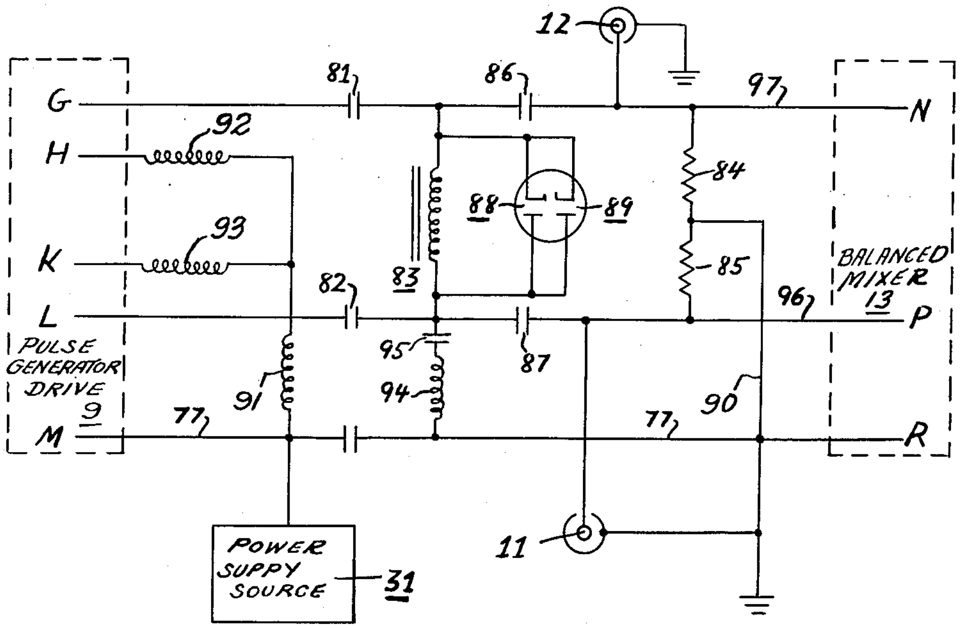
Figure 6:
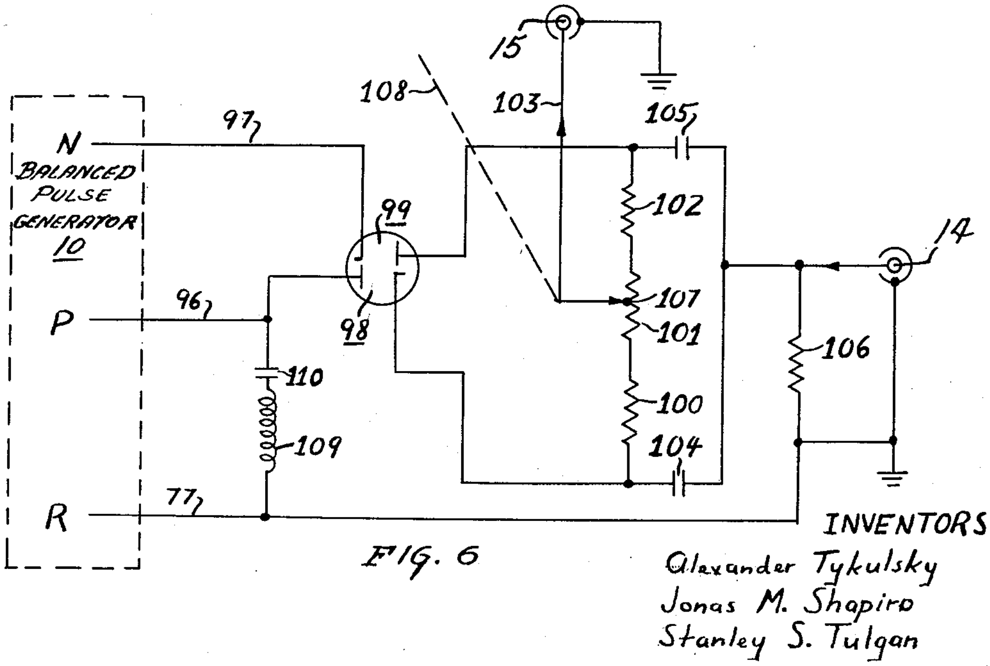

FIG. 3 is a schematic diagram of an embodiment of an amplifier arrangement which may be utilized as the amplifiers 3 and 3' in the standard frequency arrangement 1 of the circuit arrangement of the present invention shown in FIG. 1, FIG. 3 comprising a single amplifier circuit arrangement having both a buffer 3 stage and an output 3' stage;

FIG. 4 is a schematic diagram of an embodiment of a pulse generator drive which may be utilized as the pulse generator drive 9 in the circuit arrangement of the present invention shown in FIG. 1;

FIG. 5 is a schematic diagram of an embodiment of a balanced pulse generator which may be utilized as the balanced pulse generator 10 in the circuit arrangement of the present invention shown in FIG. 1; and FIG. 6 is a schematic diagram of an embodiment of a balanced mixer which may be utilized as the balanced mixer 13 in the circuit arrangement of the present invention shown in FIG. 1.

Figure 2:
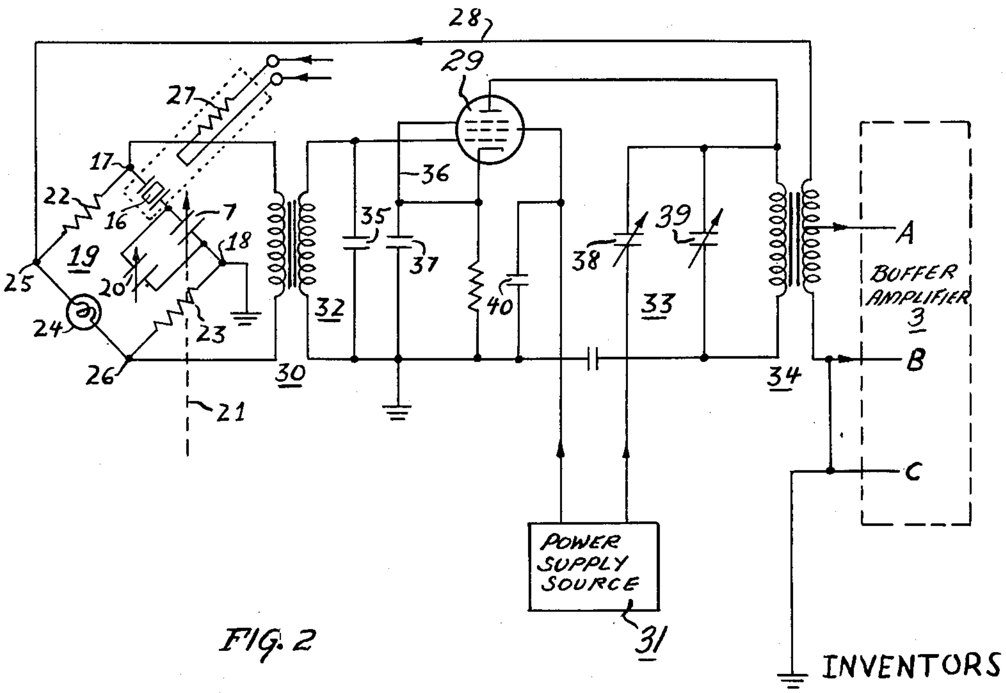
FIG. 2 is a schematic diagram of an embodiment of an oscillator circuit which may be utilized as the oscillator 2 in the standard frequency arrangement 1 of the circuit arrangement of the present invention shown in FIG. 1.

In FIG. 1, a stable standard frequency signal producing arrangement 1 comprises a stabilized oscillator arrangement 2. The oscillator 2 preferably produces a stable standard frequency signal of substantially one megacycle per second in the form of a sinusoidal output voltage which is applied to a buffer amplifier 3. The oscillator 2 is maintained at a stability of better than one part in $10^8$ per day by a proportional controlled oven arrangement 4. The proportional controlled oven arrangement 4 provides an oven temperature for the crystal of the oscillator 2 which is carefully adjusted to correspond to the turnover point of the temperature coefficient curve of said crystal. The crystal oven temperature is maintained to within a few thousandths of a degree centigrade. The proportional controlled oven arrangement 4 comprises an oven arrangement 5, which preferably comprises an oscillator-amplifier circuit arrangement operating at 2 kilocycles per second, and a thermo oven 6 containing a non-inductively wound resistance wire bridge which functions both as the temperature sensing element and as the heat producing element. The crystal of the oscillator 2 is positioned in operative relation to the heating element of the thermo oven 6 as shown in FIG. 2. The proportional controlled oven arrangement 4 may be any suitable type known in the art.

The crystal in the thermo oven 6 is coupled to the oscillator 2 through a variable regulating capacitor 7. The variable capacitor 7 permits the linear adjustment of the fundamental frequency of the oscillator 2, which is preferably one megacycle per second, plus or minus 25 cyles per second without loss of stability of the oscillator.

The oscillator 2 output voltage signal is applied to the buffer amplifier stage 3 whose output is applied to a pulse generator driving arrangement and the output voltage signal of the pulse generator driving arrangement 9 is applied to an output amplifier stage 3′ from the output terminal 8 of which is derived a sine wave output voltage signal having the standard frequency of preferably one megacycle per second. The output voltage of the pulse generator driving arrangement 9 drives a balanced pulse generator 10. The pulse generator 10 produces at its output terminals 11 and 12, respectively, positive and negative balanced pulses, respectively, which are exceptionally sharp and are substantially free from jitter. The output pulses of the pulse generator 10 are preferably millimicrosecond pulses and may contain harmonics up to 1000 megacycles per second without degradation to noise. The output pulses of the pulse generator 10 are applied to a balanced mixer arrangement 13, to an input terminal 14 of which may be applied a signal having a frequency which is desired to be measured and from the output terminal 15 of which may be derived an output beat signal having a frequency which is the difference between an unknown signal to be measured and the closest 1 megacycle harmonic. The mixer 13 is usable up to 1000 megacycles per second.

FIG. 2 is an embodiment of an oscillator arrangement which may be utilized in the standard frequency arrangement 1 of the embodiment of FIG. 1. In FIG. 2, a crystal 16 of the crystal-controlled oscillator 2 is connected in series circuit arrangement with the variable regulating capacitor 7 between points 17 and 18 to form an arm of a bridge arrangement 19. A second variable capacitor 20 is shunted across the variable capacitor 7. The capacitor 7 may be varied manually to adjust the fundamental standard frequency of the standard frequency arrangement 1 without loss of stability and is readily accessible for such control through a dial (not shown) which may be mechanically coupled thereto as indicated by a dotted line 21. The capacitor 20 is a trimmer capacitor used to produce a straight line frequency range in conjunction with the capacitor 7. The bridge 19 comprises resistance means 22 and 23 and a variable voltage resistor arm 24 connected between terminals 17 and 25, 18 and 26 and 25 and 26, respectively. The terminal 18 is preferably connected to a point at ground potential.

The temperature of the crystal 16 is maintained constant to within a few thousandths of a degree centigrade by an oven heater unit 27 which may be controlled, for example, by the oven control 5. Output signals produced by the oscillator 2 are fed back to the bridge input 25 through the feedback lead 28 and the bridge 19 is maintained in a highly sensitive balance by the impedance balancing of the arm 24 of said bridge. The bridge 19 output terminals 17 and 26 are coupled to an oscillator tube 29 through a coupling transformer 30.

The output voltage of the bridge 19 is applied to the control grid of oscillator tube 29 which is preferably a pentode having a control grid, a suppressor grid and a screen grid in addition to an anode and a cathode. The tube is powered by a power supply source 31 and has a tuned input circuit 32 and an output circuit 33 coupled to the input circuit 32 through a transformer 34, the feedback lead 28, the bridge 19 and the transformer 30. The input circuit 32 of the oscillator 2 comprises a capacitor 35 connected in parallel across the control grid of the oscillator tube 29 and across the secondary winding of the transformer 30 and has a resonant frequency of approximately one megacycle per second. The cathode and suppressor grid of the oscillator tube 29 are coupled together through a common connecting lead 36 and said common connecting lead is connected to a point at ground potential through a cathode by-pass capacitor 37. The output circuit 33 of the oscillator 2 comprises the primary winding of the transformer 34 and two capacitors 38 and 39 connected in parallel across said primary winding. The capacitor 38 is variable to permit adjustment of the resonant frequency of the output circuit 33. The screen grid of the tube 29 is connected to a point at ground potential through a by-pass capacitor 40.

The oscillator arrangement 2 is similar in structure and operation to an arrangement known in the art as a Meacham Bridge-Stabilized Oscillator. Such an arrangement is described on page 143 of a book by William A. Edson, entitled "Vacuum-Tube Oscillators," and published by John Wiley and Sons, Inc., of New York City, 1953.

FIG. 3 is an embodiment of an amplifier arrangement comprising a buffer amplifier stage and an output amplifier stage which may be utilized as the buffer amplifier stage 3 and the output amplifier stage 3′ in the standard frequency arrangement 1 of the embodiment of FIG. 1. The output voltage signals of the oscillator 2 are applied to the control grid of a buffer amplifier tube 41 through connecting leads 42 and 43. Each of the buffer amplifier tube 41 and an output amplifier tube 44 is preferably a pentode having a control grid, a suppressor grid and a screen grid besides a cathode and an anode. The tubes 41 and 44 are powered by the power supply source 31 through a lead 45 which is connected in common to the screen grids of said tubes through resistors 46 and 47, respectively. The cathodes of the tubes 41 and 44 are connected through resistors 48 and 49, respectively, to a point at ground potential through the lead 43 and the suppressor grids of the tubes 41 and 44 are connected through capacitors 50 and 51, respectively, to a point at ground potential through said lead 43. The screen grids of the tubes 41 and 44 are connected through capacitors 52 and 53, respectively, to a point at ground potential through the lead 43. The tubes 41 and 44 have output circuits 54 and 55, respectively; the output circuit 54 being coupled to a transformer 56 through which the amplifier output voltage signal is applied to the pulse generator driving arrangement 9 and from the output of which is derived the input voltage for the output amplifier. The output circuit 54 comprises a capacitor 57 connected across the primary winding of the transformer 56. The output circuit 55 comprises two capacitors 58 and 59, connected in series circuit arrangement across a variable inductance 60. The output circuit 55 is connected to a point at ground potential through a capacitor 61; a capacitor 62 coupled to the output circuit 54 being a by-pass capacitor. The sinusoidal standard frequency output signal of the standard frequency arrangement 1 may be derived from the output terminal 8 which is connected to a point in the connecting lead between the capacitors 58 and 59. The terminal 8 may comprise, for example, a single plug jack arrangement. The output of the buffer amplifier is derived from a connection to the anode of the tube 41 and is applied through the transformer 56 to the pulse generator drive 9 and to an input potentiometer 63 of the output amplifier. The potentiometer 63 is connected to load resistors 64 and 65 which are connected in series arrangement, the series arrangement being connected across the secondary winding of the transformer 56. The tapping point of the potentiometer 63 is connected to the control grid of the output amplifier tube 44.

The power lead 45 is connected to a point in the common connection between decoupling resistors 66 and 67 included in the connection between the output circuits 54 and 55. The amplifier operation is that of a cascade amplifier, the buffer and output amplifiers being cascaded.

FIG. 4 is an embodiment of a pulse generator drive which may be utilized as the pulse generator drive 9 of the embodiment of FIG. 1. The pulse generator drive arrangement 9 serves to amplify the standard frequency signal derived from the buffer amplifier of the amplifier 3 through the transformer 56 and to drive the pulse generator 10 therewith. The output voltage signal of the buffer amplifier is applied in push-pull to the control grids of amplifier tubes 68 and 69 through coupling capacitors 70 and 71, respectively. Grid leak resistor 72 is connected between the control grid of the tube 68 and ground and grid leak resistor 73 is connected between the control grid of the tube 69 and ground. The amplifier tubes 68 and 69 are preferably pentodes each having a control grid, a suppressor grid and a screen grid besides an anode and a cathode. The resistors 64 and 65 (shown in FIG. 3) and 72 and 73 and the cathodes and suppressor grids of the tubes 68 and 69, as well as capacitors 74 and 75, are connected to a point at ground potential through a common lead 76. The tubes 68 and 69 are powered by the power supply source 31 (not shown in FIG. 4) through a lead 77 which is connected in common to the screen grids of said tubes through resistors 78 and 79, respectively, and is connected between said resistors and a point at ground potential (not shown in FIG. 4). The output of the pulse generator drive is derived from a common connection between the anodes of the tubes 68 and 69 and is applied across a variable inductance 80 to the pulse generator 10. The pulse generator drive operation is that of a class C push-pull amplifier.

FIG. 5 is an embodiment of a balanced pulse generator which may be utilized as the balanced pulse generator 10 of the embodiment of FIG. 1. The pulse generator arrangement 10 serves to provide a balanced pulse output which is substantially jitter-free and which preferably has a usable harmonic output up to 1000 megacycles per second. The pulses produced by the pulse generator 10 are of millimicrosecond duration and are exceptionally sharp; positive pulses being derived from the positive pulse output terminal 11 and negative pulses being derived from the negative pulse output terminal 12. Either of the terminals 11 and 12 may be grounded in order to permit the derivation of a stronger single ended pulse from the other of the terminals 12 and 11, respectively.

The variable inductance 80 (shown in FIG. 4) and two capacitors 81 and 82 normally constitute a circuit tuned to one megacycle per second. Actually, the tuned circuit is completed through a saturable reactor 83. The saturable reactor 83 represents a high impedance when it carries a relatively low current and it represents a low impedence when it carries a relatively high current. Therefore, when the current through the reactor 83 is relatively low the tuned circuit 80, 81, 82, 83 is substantially open and when the current through the reactor 83 is relatively high the tuned circuit is closed. Thus, the tuned circuit is complete only when the current through the reactor 83 is relatively high, because then said reactor constitutes a closed circuit. For a very brief interval occurring twice during each cycle the current in the reactor 83 is very low and accordingly the tuned circuit 80, 81, 82, 83 is substantially open.

The opening and closing of the tuned circuit 80, 81, 82, 83 produces sharp pulses which are coupled to output resistors 84 and 85 and differentiated through capacitors 86 and 87, respectively. A pair of diodes 88 and 89 functions to eliminate one of the pair of pulses occurring during each cycle, so that positive pulses appear at the output terminal 11 and negative pulses appear at the output terminal 12.

Pulses appearing at the output terminals 11 and 12 occur simultaneously, but are of opposite polarity, since the entire pulse generator arrangement is symmetrical and is in push-pull operation. The pulses appearing at the output terminals 11 and 12 are virtually jitter-free since their production is not dependent upon synchronization of an active free-running oscillator which might be subject to the influence of noise, but depends only on the values of the current flowing through the saturable reactor 83.

Pulses produced by the pulse generator arrangement are applied from across the output resistors 84 and 85 to the balanced mixer 13. The output resistors 84 and 85 are connected to a point at ground potential through a lead 90. The tubes 68 and 69 are powered by the power supply source 31 through a series-connected inductance 91 and parallel-connected inductances, or chokes, 92 and 93, which are connected respectively to each side of the variable inductance 90 (shown in FIG. 4). A series arrangement of an inductor 94 and a capacitor 95 is connected between the lead 77 and the common anode connection of the diodes 88 and 89. The series arrangement 94, 95 functions to simulate the impedance of the cathode to ground of the diodes 88 and 89 in order to maintain the circuit arrangement in balance. Although the diodes 88 and 89 are shown in a single envelope they may be separate tubes in separate envelopes.

FIG. 6 is an embodiment of a balanced mixer which may be utilized as the balanced mixer 13 of the embodiment of FIG. 1. The mixer arrangement 13 serves to provide a measurement indication of a signal having a frequency to be measured to a frequency of 1000 megacycles per second. A signal having the frequency to be measured may be applied to the input terminal 14 which may comprise, for example, a single plug jack arrangement. A signal indicating the frequency to be measured may be derived from the output terminal 15 which may also comprise a single plug jack arrangement.

The positive pulses produced by the pulse generator 10 are applied through a connecting lead 96 to the anode of a tube 98 and the negative pulses produced by said pulse generator are applied through a connecting lead 97 to the cathode of a tube 99. The tubes 98 and 99 are preferably diodes and may be housed in a single envelope, as shown in FIG. 6.

The output signal of the mixer 13 is produced across resistors 100, 101 and 102 which are connected in series circuit arrangement between the cathode of the tube 98 and the anode of the tube 99. The resistor 101 has an adjustable tapping point thereon to which the output terminal 15 is connected by a lead 103. A resistor 106 constitutes a load impedance for the incoming signal which is to be measured at the input terminal 14.

The diodes 98 and 99 function as peak detectors and measure the difference between the peak voltages of the pulses applied to the anode of the diode 98 and the cathode of the diode 99 and the voltage at the input terminal 14. The diode 99 functions as a negative peak detector and the diode 98 functions as a positive peak detector, so that if no input signal is received at the input terminal 14 a zero voltage will appear at a tapping point 107 on the resistor 101. This is due to the fact that the output of the diode 99 will be a negative voltage and the output of the diode 98 will be a positive voltage of the same magnitude as the negative voltage output of the diode 99, so that these output voltages cancel each other. If a signal appearing at the input terminal 14 adds to the plate to cathode voltage of the diode 99, it subtracts from the plate to cathode voltage of the diode 98 and vice versa, so that a voltage of either positive or negative polarity appears at the point 107 when a signal appears at said input terminal. If a signal appearing at the input terminal 14 has a frequency which is close to one megacycle per second or harmonics of one megacycle per second the voltage appearing at the point 107 will be a beat frequency representing the difference in frequency between the signal appearing at said terminal 14 and the closest harmonic of one megacycle per second.

The coupling capacitors 104 and 105 in conjunction with the resistors 100, 101 and 102 and the load resistor 106 produce a time constant; the larger the time constant, the lower the amount of undesirable pulse content appearing at the output terminal 15. At the same time, the larger the time constant, the lower the amplitude of the beat frequency delivered at the output terminal 15 as said frequency is increased. The pulses applied to the anode of the diode 98 and the cathode of the diode 99 are not fed through to the input terminal 14 because they are of opposite polarity with respect to said terminal 14 and must therefore cancel.

The tapping point 107 may be varied manually to adjust the voltage at said point to zero when no input signal appears at the input terminal 14 and is readily accessible for such control through a dial or knob which may be mechanically coupled thereto as indicated by a dotted line 108.

A series arrangement of an inductor 109 and a capacitor 110 is connected between the lead 77 and the anode of the diode 98. The series arrangement 109, 110 functions to simulate the impedance of the cathode to ground of the diodes 98 and 99 in order to maintain the circuit arrangement in balance.

The power supply source 31 may comprise any suitable means for producing a regulated D.C. voltage, preferably at 250 volts D.C., and an unregulated A.C. voltage, preferably at 6.3 volts for the heater. A suitable unregulated voltage may be used for the high voltage supply as well as a suitable regulated D.C. voltage.

While the invention has been described by means of a specific example and in a specific embodiment, we do not wish to be limited thereto, for obvious modifications will occur to those skilled in the art without departing from the spirit and scope of the invention.

What we claim is:

1. A circuit arrangement comprising means for producing a stable standard frequency signal, said standard frequency producing means comprising crystal-controlled oscillator means having a piezoelectric crystal element and means for stabilizing said oscillator means comprising means for maintaining said crystal element at a substantially constant temperature and means for linearly adjusting said standard frequency, means for deriving from said standard frequency means a substantially sinusoidal output signal having a frequency equal to said standard frequency, means for producing positive and negative pulses from said output signal, means for deriving said pulses from said pulse producing means, means for applying said output signal to said pulse producing means comprising amplifying means interposed between said standard frequency producing means and said pulse producing means, means for mixing said pulses with a signal having a frequency to be measured, means for applying said pulses to said mixing means, means for applying to said mixing means a signal having a frequency to be measured, and means for deriving from said mixing means a signal having a frequency indicative of said frequency to be measured.

2. A circuit arrangement comprising means for producing a stable standard frequency signal, means for deriving from said standard frequency means a substantally sinusoidal output signal having a frequency equal to said standard frequency, means for producing positive and negative pulses from said output signal, means for deriving said pulses from said pulse producing means, means for applying said output signal to said pulse producing means comprising amplifying means interposed between said standard frequency producing means and said pulse producing means, said amplifying means comprising a buffer amplifier stage, an output amplifier stage in cascade connection with said buffer stage, a push-pull amplifier stage coupled to the output of said buffer stage and means for deriving said output signal from said output stage, the output of said push-pull stage being applied to said pulse producing means, means for mixing said pulses with a signal having a frequency to be measured, means for applying said pulses to said mixing means, means for applying to said mixing means a signal having a frequency to be measured, and means for deriving from said mixing means a signal having a frequency indicative of said frequency to be measured.

3. A circuit arrangement comprising means for producing a stable standard frequency signal, means for deriving from said standard frequency means a substantially sinusoidal output signal having a frequency equal to said standard frequency, means for producing positive and negative pulses from said output signal, said pulse producing means comprising a tuned circuit comprising a variable inductance, a saturable reactor and a pair of capacitors, one of said capacitors being coupled between a terminal of said inductance and a corresponding terminal of said saturable reactor and the other of said capacitors being coupled between the other terminal of said inductance and the corresponding terminal of said saturable reactor, said saturable reactor presenting a relatively high impedance when the current flowing therein is relatively low and presenting a relatively low impedance when the current flowing therein is relatively high, means for deriving said pulses from said pulse producing means, means for applying said output signal to said pulse producing means comprising amplifying means interposed between said standard frequency producing means and said variable inductance, means for mixing said pulses with a signal having a frequency to be measured, means for applying said pulses to said mixing means, means for applying to said mixing means a signal having a frequency to be measured, and means for deriving from said mixing means a signal having a frequency indicative of said frequency to be measured.

4. A circuit arrangement comprising means for producing a stable standard frequency signal, means for deriving from said standard frequency means a substantially sinusoidal output signal having a frequency equal to said standard frequency, means for producing positive and negative pulses from said output signal, said pulse producing means comprising a tuned circuit comprising a variable inductance, a saturable reactor and a pair of capacitors, one of said capacitors being coupled between a terminal of said inductance and a corresponding terminal of said saturable reactor and the other of said capacitors being coupled between the other terminal of said inductance and the corresponding terminal of said saturable reactor, said saturable reactor presenting a relatively high impedance when the current flowing therein is relatively low and presenting a relatively low impedance when the current flowing therein is relatively high, a pair of output resistors, means coupling said output resistors across said saturable reactor, said coupling means comprising a pair of differentiating capacitors, one of said differentiating capacitors being coupled between a terminal of said saturable reactor and a terminal of one of said output resistors and the other of said differentiating capacitors being coupled between the other terminal of said saturable reactor and a terminal of the other of said output resistors, and a pair of diodes having common cathode and anode connections, said diodes being connected in parallel arrangement across said saturable reactor, means for deriving said pulses from said differentiating capacitors, means for applying said output signal to said pulse producing means comprising amplifying means interposed between said standard frequency producing means and said variable inductance, means for mixing said pulses with a signal having a frequency to be measured, means for applying pulses derived from said output resistors to said mixing means, means for applying to said mixing means a signal having a frequency to be measured, and means for deriving from said mixing means a signal having a frequency indicative of said frequency to be measured.

5. A circuit arrangement comprising means for producing a stable standard frequency signal, means for deriving from said standard frequency means a substantially sinusoidal output signal having a frequency equal to said standard frequency, means for producing positive and negative pulses from said output signal, means for deriving said pulses from said pulse producing means, means for applying said output signal to said pulse producing means comprising amplifying means interposed between said standard frequency producing means and said pulse producing means, means for mixing said pulses with a signal having a frequency to be measured, and means for applying said pulses to said mixing means, said pulse applying means having a pair of output terminals, said mixing means comprising peak detecting means for measuring the difference between the peak voltages of said positive and negative pulses and the voltage of said signal having a frequency to be measured, said peak detecting means comprising resistive means having a pair of end terminals and a tapping point intermediate said end terminals, a first diode coupled in a first conducting direction between an output terminal of said pulse applying means and an end terminal of said resistive means, and a second diode coupled in a conducting direction opposite said first direction between the other output terminal of said pulse applying means and the other end terminal of said resistive means, means for applying across said resistive means a signal having a frequency to be measured and means for deriving from said tapping point a signal having a frequency indicative of said frequency to be measured.

6. A circuit arrangement comprising means for producing a stable standard frequency signal, means for deriving from said standard frequency means a substantially sinusoidal output signal having a frequency equal to said standard frequency, means for producing positive and negative pulses from said output signal, means for deriving said pulses from said pulse producing means, means for applying said output signal to said pulse producing means comprising amplifying means interposed between said standard frequency producing means and said pulse producing means, means for mixing said pulses with a signal having a frequency to be measured, said mixing means comprising peak detecting means for measuring the difference between the peak voltages of said positive and negative pulses and the voltage of said signal having a frequency to be measured, said peak detecting means comprising resistive means having a pair of end terminals and a tapping point intermediate said end terminals, a third diode coupled in a first conducting direction between said terminal of said one output resistor and an end terminal of said resistive means, and a fourth diode coupled in a conducting direction opposite said first direction between said terminal of said output resistor and the other end terminal of said resistive means, means for applying across said resistive means a signal having a frequency to be measured and means for deriving from said tapping point a signal having a frequency indicative of said frequency to be measured.

7. A circuit arrangement comprising means for producing a stable standard frequency signal, means for deriving from said standard frequency means a substantially sinusoidal output signal having a frequency equal to said standard frequency, means for producing positive and negative pulses from said output signal, said pulse producing means comprising a tuned circuit comprising a variable inductance, a saturable reactor and a pair of capacitors, one of said capacitors being coupled between a terminal of said inductance and a corresponding terminal of said saturable reactor and the other of said capacitors being coupled between the other terminal of said inductance and the corresponding terminal of said saturable reactor, said saturable reactor presenting a relatively high impedance when the current flowing therein is relatively low and presenting a relatively low impedance when the current flowing therein is relatively high, a pair of output resistors, means coupling said ouptut resistors across said saturable reactor, said coupling means comprising a pair of differentiating capacitors, one of said differentiating capacitors being coupled between a terminal of said saturable reactor and a terminal of one of said output resistors and the other of said differentiating capacitors being coupled between the other terminal of said saturable reactor and a terminal of the other of said output resistors, and a pair of diodes having common cathode and anode connections, said diodes being connected in parallel arrangement across said saturable reactor, means for deriving said pulses from said differentiating capacitors, means for applying said output signal to said pulse producing means comprising amplifying means interposed between said standard frequency producing means and said variable inductance, said amplifying means comprising a buffer amplifier stage, an output amplifier stage in cascade connection with said buffer stage, a push-pull amplifier stage coupled to the output of said buffer stage, means for deriving said output signal from said output stage and means for applying the output of said push-pull stage across said variable inductance, means for mixing said pulses with a signal having a frequency to be measured, said mixing means comprising peak detecting means for measuring the difference between the peak voltages of said positive and negative pulses and the voltage of said signal having a frequency to be measured, said peak detecting means comprising resistive means having a pair of end terminals and a tapping point intermediate said end terminals, a third diode coupled in a first conducting direction between said terminal of said one output resistor and an end terminal of said resistive means, and a fourth diode coupled in a conducting direction opposite said first direction between said terminal of said other output resistor and the other end terminal of said resistive means, means for applying across said resistive means a signal having a frequency to be measured and means for deriving from said tapping point a signal having a frequency indicative of said frequency to be measured.

8. A circuit arrangement comprising means for producing a stable standard frequency signal, said standard frequency producing means comprising crystal-controlled oscillator means having a piezoelectric crystal element and means for stabilizing said oscillator means comprising means for maintaining said crystal element at a substantially constant temperature and means for linearly adjusting said standard frequency, means for deriving from said standard frequency means a substantially sinusoidal output signal having a frequency equal to said standard frequency, means for producing positive and negative pulses from said output signal, said pulse producing means comprising a tuned circuit comprising a variable inductance, a saturable reactor and a pair of capacitors, one of said capacitors being coupled between a terminal of said inductance and a corresponding terminal of said saturable reactor and the other of said capacitors being coupled between the other terminal of said inductance and the corresponding terminal of said saturable reactor, said saturable reactor presenting a relatively high impedance when the current flowing therein is relatively low and presenting a relatively low impedance when the current flowing therein is relatively high, a pair of output resistors, means coupling said output resistors across said saturable reactor, said coupling means comprising a pair of differentiating capacitors, one of said differentiating capacitors being coupled between a terminal of said saturable reactor and a terminal of one of said output resistors and the other of said differentiating capacitors being coupled between the other terminal of said saturable reactor and a terminal of the other of said output resistors, and a pair of diodes having common cathode and anode connections, said diodes being connected in parallel arrangement across said saturable reactor, means for deriving said pulses from said differentiating capacitors, means for applying said output signal to said pulse producing means comprising amplifying means interposed between said standard frequency producing means and said variable inductance, said amplifying means comprising a buffer amplifier stage, an output amplifier stage in cascade connection with said buffer stage, a push-pull amplifier stage coupled to the output of said buffer stage, means for deriving said output signal from said output stage and means for applying the output of said push-pull stage across said variable inductance, means for mixing said pulses with a signal having a frequency to be measured, said mixing means comprising peak detecting means for measuring the difference between the peak voltages of said positive and negative pulses and the voltage of said signal having a frequency to be measured, said peak detecting means comprising resistive means having a pair of end terminals and a tapping point intermediate said end terminals, a third diode coupled in a first conducting direction between said terminal of said one output resistor and an end terminal of said resistive means, and a fourth diode coupled in a conducting direction opposite said first direction between said terminal of said other output resistor and the other end terminal of said resistive means, means for applying across said resistive means a signal having a frequency to be measured and means for deriving from said tapping point a signal having a frequency indicative of said frequency to be measured.

References Cited in the file of this patent

UNITED STATES PATENTS

| | | |
|---|---|---|
| 2,178,225 | Diehl et al. | Oct. 31, 1939 |
| 2,337,328 | Hathaway | Dec. 21, 1943 |
| 2,380,288 | Bligh et al. | July 10, 1945 |
| 2,476,840 | Colander | July 19, 1949 |
| 2,491,494 | Grimm | Dec. 20, 1949 |
| 2,595,675 | Jaynes | May 6, 1952 |
| 2,609,509 | Hill | Sept. 2, 1952 |
| 2,614,221 | Moll | Oct. 14, 1952 |
| 2,685,648 | Budelman | Aug. 3, 1954 |
| 2,783,379 | Fleming | Feb. 26, 1957 |
| 2,830,379 | White | Apr. 8, 1958 |
| 2,833,987 | Shepard | May 6, 1958 |
| 2,892,944 | Wu | June 30, 1959 |
| 2,896,161 | Fox | July 21, 1959 |
| 2,930,892 | Palmer | Mar. 29, 1960 |

FOREIGN PATENTS

| | | |
|---|---|---|
| 598,203 | Great Britain | Feb. 12, 1948 |

OTHER REFERENCES

Radio, March 1940; pages 17–22.

General Radio Experimenter, February 1947, copyright 1947, General Radio Co., Cambridge, Mass., U.S.A.; pages 1–8.

Electronic Measurements, text by Terman and Petit; McGraw-Hill Book Co., Inc., 2nd edition (1952), page 210.

"The Primary Frequency Standard Type 1100–AP," article in Frequency Measuring Equipment, page 161, publication by General Radio Co. (date unknown).